United States Patent [19]
Tanaka et al.

[11] Patent Number: 5,733,687
[45] Date of Patent: Mar. 31, 1998

[54] PHOTOMASK, EXPOSING METHOD USING PHOTOMASK, AND MANUFACTURING METHOD OF PHOTOMASK

[75] Inventors: Satoshi Tanaka, Kawasaki; Shoji Mimotogi, Sagamihara; Tadahito Fujisawa, Tokyo; Soichi Inoue, Yokohama, all of Japan

[73] Assignee: Kabushiki Kaisha Toshiba, Kawasaki, Japan

[21] Appl. No.: 536,148

[22] Filed: Sep. 29, 1995

[30] Foreign Application Priority Data

Sep. 29, 1994 [JP] Japan ................... 6-233926
Sep. 19, 1995 [JP] Japan ................... 7-240002

[51] Int. Cl.$^6$ .................................... G03F 9/00
[52] U.S. Cl. ..................... 430/5; 430/311; 430/322
[58] Field of Search ................... 430/5, 311, 312, 430/322

[56] References Cited

U.S. PATENT DOCUMENTS 4,360,586  11/1982  Flanders et al. ................ 430/321
5,429,896   7/1995  Hasegawa et al. .................. 430/5

FOREIGN PATENT DOCUMENTS 4-165352  6/1992  Japan.
6-175347  6/1994  Japan.

*Primary Examiner*—S. Rosasco
*Attorney, Agent, or Firm*—Oblon, Spivak, McClelland, Maier & Neustadt, P.C.

[57] ABSTRACT

When a pattern to be exposed onto a wafer is a periodic pattern, a periodic mask pattern substantially twice as large as the pattern to be exposed in the wafer is formed on a photomask by means of light transmission portions and halftone portions. The halftone portions are formed such that a phase difference between exposure light transmitted through the light transmission portions and exposure light transmitted through the halftone portions is set to be substantially 180°. Moreover, in order to eliminate zeroth order diffraction light, amplitude transmittance t of the halftone portion is set to t≈A1/A2 wherein A1 is an area of the halftone portion and A2 is an area of the light transmission portion. Further, amplitude transmittance t of the halftone portion is changed, and an amount of exposure light to the photomask is controlled, so that L&S patterns and isolated patterns are simultaneously transferred onto the wafer by one photomask.

14 Claims, 8 Drawing Sheets

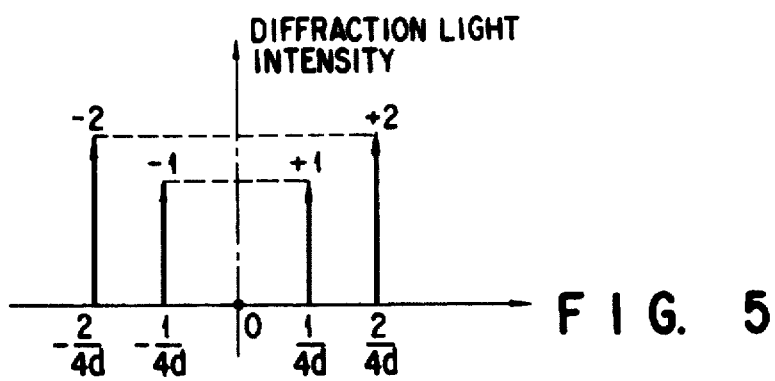
FIG. 5
FIG. 7A
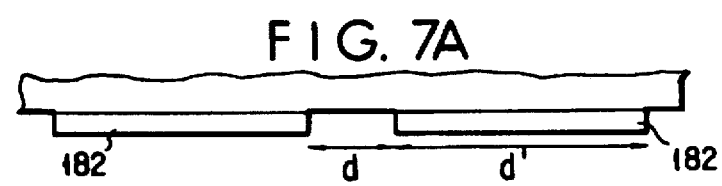
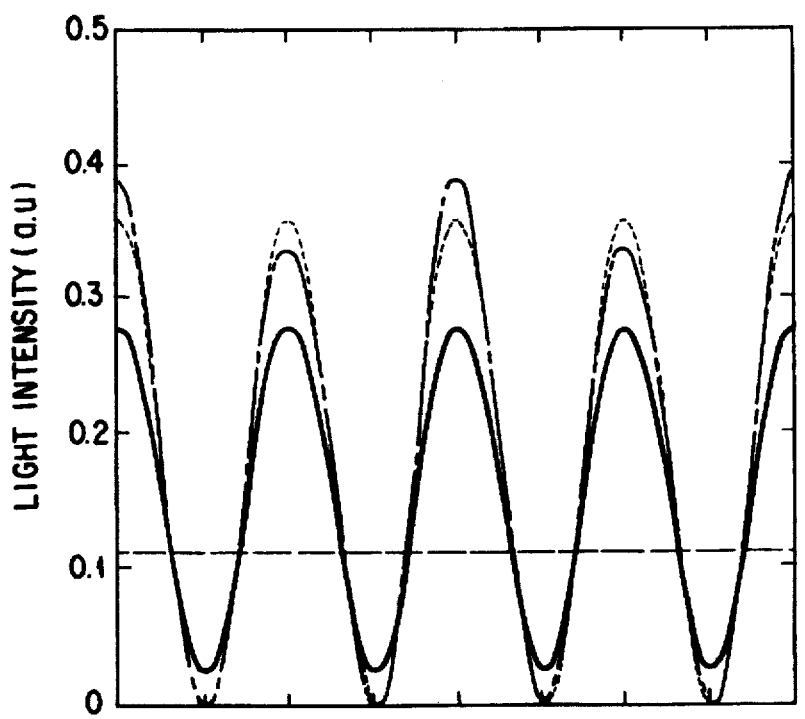
——— : d = 0.15 μm (0.302 λ/NA)
---------- : d = 0.18 μm (0.363 λ/NA)
— · — : d = 0.2 μm (0.403 λ/NA)
— · · — : d : d' = 1:1 HALFTONE MASK d=0.18μm
  σ = 0.5
LIGHT INTENSITY
DISTRIBUTION (NA=0.5, λ=248nm, σ=0.3)
FIG. 7B

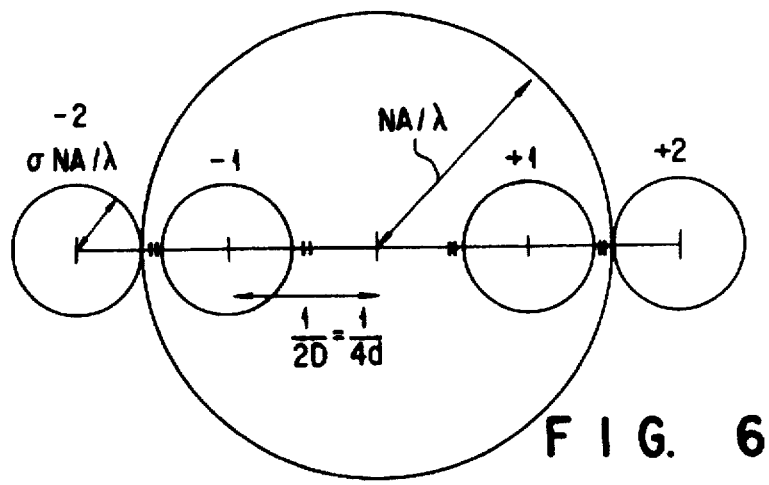
F I G. 6
d = 0.2μm, d'= 0.6μm (CONVERTED VALUE ONTO WAFER)
TRANSMITTANCE OF HALFTONE PORTION   T = 2%
(AMPLITUDE TRANSMITTANCE t = 1/7)
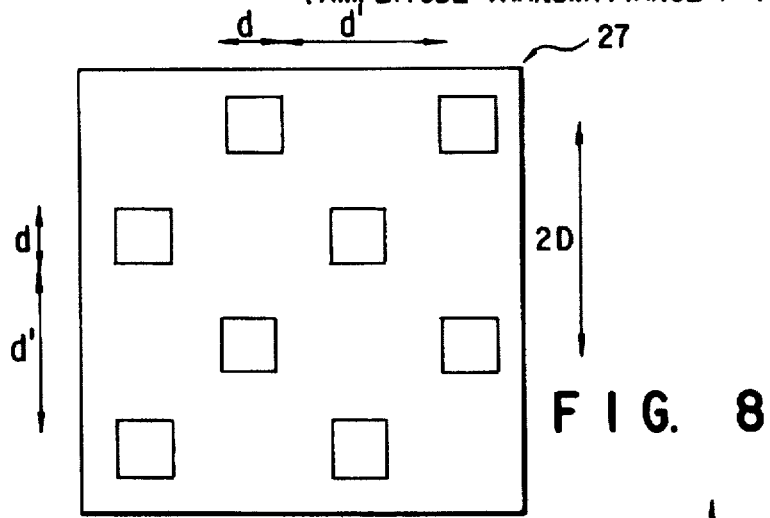
F I G. 8
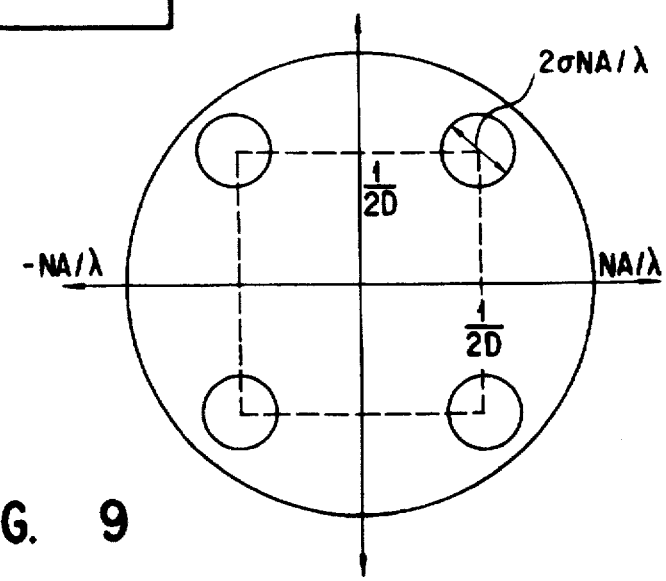
F I G. 9

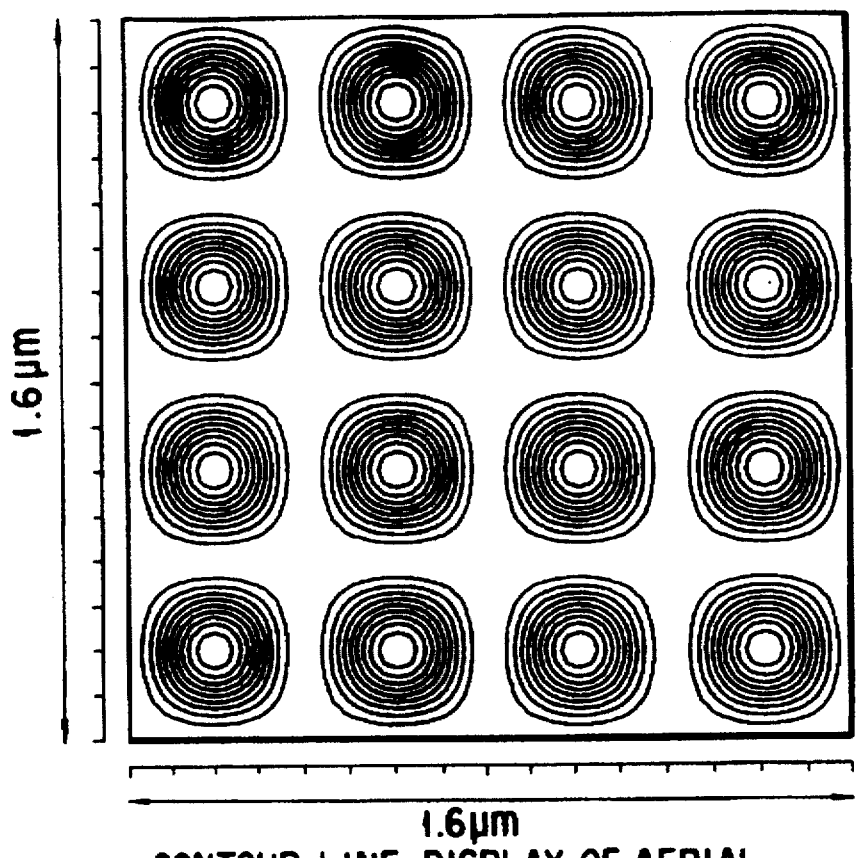
CONTOUR LINE DISPLAY OF AERIAL IMAGE
F I G. 10
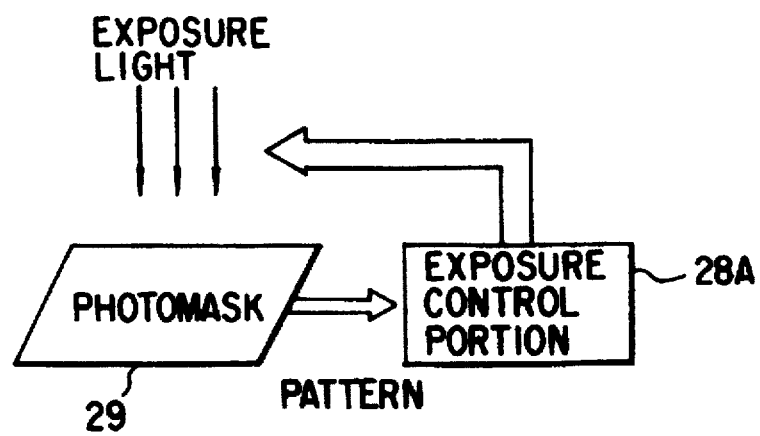
F I G. 12

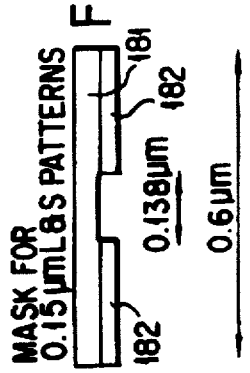
FIG. 11A(1)
MASK FOR 0.15μm L&S PATTERNS
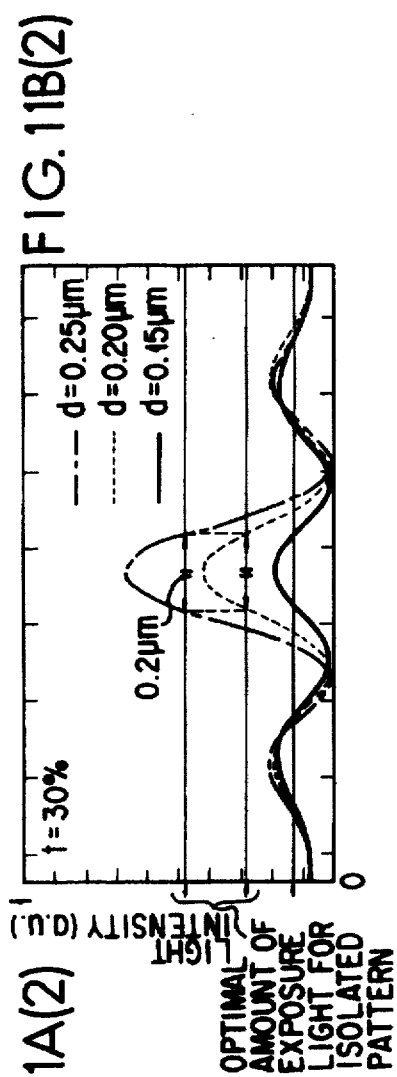
FIG. 11A(2)
FIG. 11A(3)
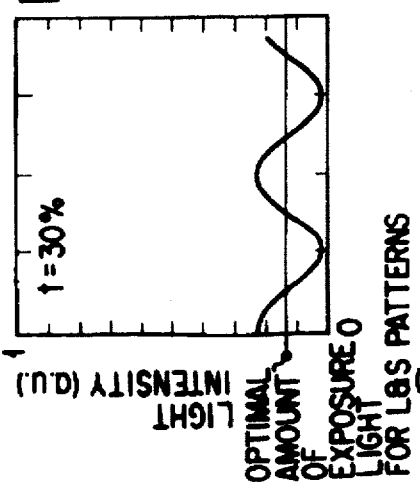
FIG. 11B(1)
ISOLATED SPACE PATTERN
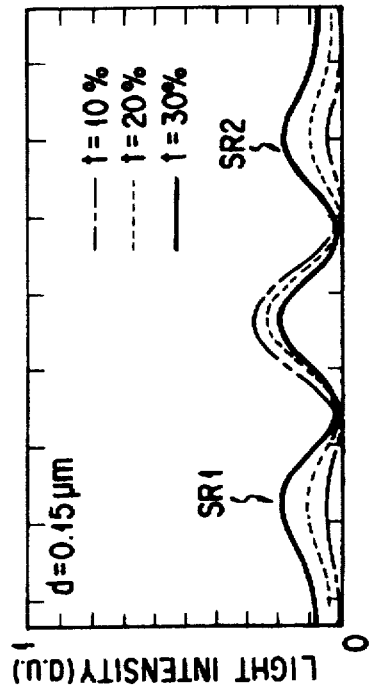
FIG. 11B(2)
FIG. 11B(3)

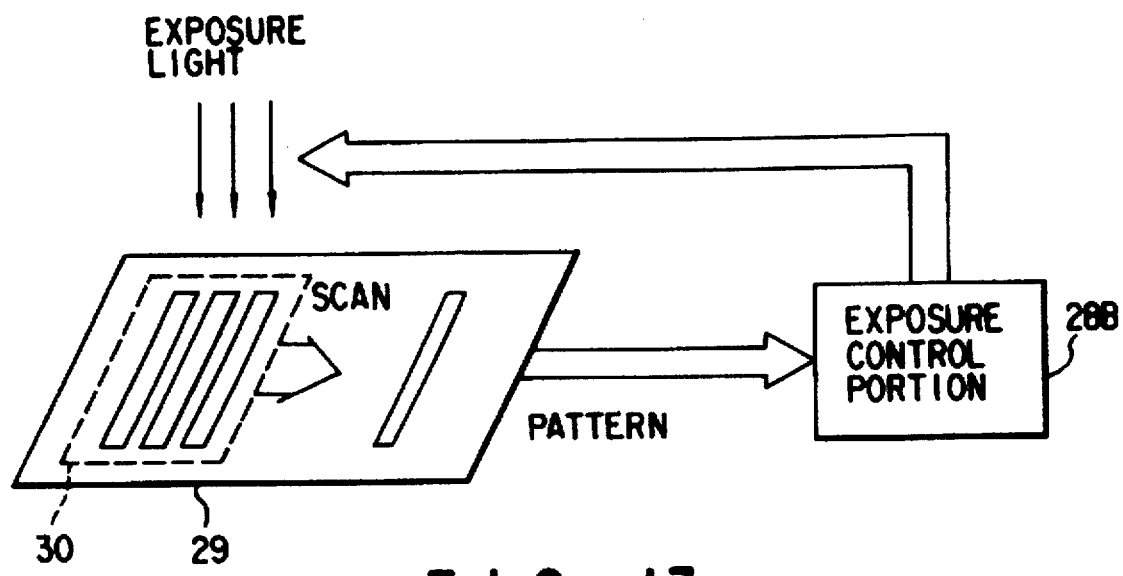
F I G. 13
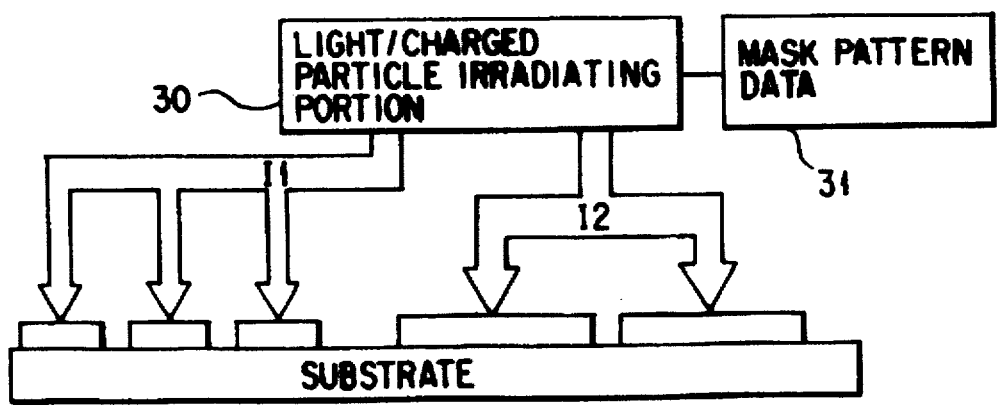
F I G. 14

PHOTOMASK, EXPOSING METHOD USING PHOTOMASK, AND MANUFACTURING METHOD OF PHOTOMASK

BACKGROUND OF THE INVENTION

1. Field of the Invention

The present invention relates to a photomask used in manufacturing a semiconductor device and an exposing method using the photomask, and particularly to a photomask, which is applicable to exposure of both a line and space pattern (L&S pattern) and an isolated pattern (contact hole, isolated space pattern, isolated line pattern) with high resolution, and an exposing method using the photomask. Moreover, the present invention relates to a method for manufacturing the above photomask.

2. Description of the Related Art

In recent years, the technique of optical lithography has been considerably advanced. Such advancements, include use of short wavelength of exposure light (for example, i-line (365 nm), KrF excimer laser (248 nm)), high performance of a projection exposure apparatus, and use of a high NA (numerical aperture) lens. Particularly, a fine resist pattern can be formed on a wafer by use high NA of the lens. Moreover, resolution and a depth of focus are improved by use of some super-resolution techniques, such as a phase-shifting mask, annular illumination, etc.

As a method for improving resolution of the projection exposure apparatus, there is known a method in which a phase of light transmitted through a mask is partially shifted, that is, the phase of light transmitted through adjacent two transparent portions (light transmitting portions) on a mask is reversed at 180°, thereby improving a contrast of an optical image. Regarding a mask pattern by which the phase of light transmitted through adjacent two transmitting portions on the mask is shifted, there is proposed a discussion in "Improving Resolution in Photolithography 10 with a Phase-shifting Mask" by Mark. D. Levenson, in IEEE Transition on Electron Devices, Vol ED-29 No. 12, 1982, page 1828.

The following will explain the mask proposed in the above document with reference to FIGS. 1A to 1E.

FIG. 1A shows a structure of a Levenson type phase-shifting mask. On a mask substrate 1, opaque portions 2 are formed. There are formed layers 3 (hereinafter called shifters) for changing the phase of an illumination light thereon. The shifters 3 are provided for respective phases of exposure light transmitted through the adjacent transmitting portions (for example, portion through which exposure light is passed (shown by an arrow)). A thickness (d1 th) of each shifter 3 can be expressed by the following equation:

$$d1th = \lambda/\{2(n-1)\}$$

wherein n: refractive index, $\lambda$: wavelength of exposure light.

Since the phase of light transmitted through the shifter 3 is opposite to the phases of the other transmitted light, light intensity becomes 0 at a pattern boundary portion, so that the pattern is separated, and resolution is improved. Moreover, amplitude transmittance of light irradiated onto the mask of FIG. 1A in a direction of the arrow is shown by FIG. 1B. FIGS. 1C to 1E are a distribution of diffraction light intensity at a pupil position, a distribution of light amplitude at an image-formed surface, and a distribution of light intensity at the above surface, respectively, when the Levenson type phase-shifting mask is irradiated with light emitted from a point light source. As shown in these figures, in the Levenson type phase-shifting mask, zeroth order diffraction light disappears by interference of light transmitted through adjacent apertures, and ±1st order diffraction light is generated. The ±1st order diffraction light is image-formed on a wafer surface, so that limitation of resolution is multiplied as compared with the normal case, and the depth of focus is also improved. However, in the Levenson type phase-shifting mask, there are needed two manufacturing steps of forming the opaque portions and shifters. The Levenson type phase-shifting mask is useful in exposing the L&S patterns. However, there is left a problem in which such the phase-shifting mask cannot be applied to an isolated pattern such the contact hole, an isolated space pattern, and an isolated line pattern.

FIGS. 2A to 2E explain a transmission type phase-shifting mask (hereinafter called halftone type phase-shifting mask).

The halftone type phase-shifting mask has a structure as shown in FIG. 2A. More specifically, on the mask substrate 1, there are formed halftone portions 4 in place of the opaque portions, which are generally formed of a Cr film. The halftone portions 4 are formed to slightly transmit light and have a phase difference of $\pi$ between the apertures and the halftone portions 4. The halftone type phase-shifting mask is disclosed in, for example, U.S. Pat. No. 4,890,309 by MIT (Massachusetts Institute of Technology). In this case, amplitude transmittance of the halftone type phase-shifting mask of FIG. 2A is shown in FIG. 2B.

FIGS. 2C to 2E are a distribution of diffraction light intensity at a pupil position, a distribution of light amplitude at an image-formed surface, and a distribution of light intensity at the above surface, respectively, when the halftone type phase-shifting mask is irradiated with light emitted from a point light source. As shown in these figures, in exposure light transmitting through the halftone type phase-shifting mask, zeroth order diffraction light intensity is lowered, and a half bandwidth of an image at the time of image-forming is reduced. Thereby, limitation of resolution is improved. Moreover, an oblique illumination is used as an illumination method, so that two beam interference, which is equivalent to the case of the Levenson type phase-shifting mask, can be used in place of the normal three beam interference, and resolution can be improved. In forming the halftone type phase-shifting mask, it is possible to manufacture the opaque portions and the phase-shifting portions with the same manufacture as halftone portions 4. Therefore, the halftone type phase-shifting mask can be manufactured by one step of the halftone portions 4. Such halftone type phase-shifting mask can be applied to the isolated pattern such as a contact hole, isolated space pattern or isolated line pattern. However, in the halftone type phase-shifting mask, considerable effect is not generated in a periodic pattern such as the L&S pattern. Therefore, it is needed that a modified illumination such as the annular illumination and a quadruple (four-eye) illumination serving as the above-mentioned oblique illumination, be combined with the exposure of the periodical pattern. However, in a case where the halftone type mask is combined with the modified illumination as the oblique illumination, unfavorable influence is exerted on resolution of the isolated pattern. In this case, the periodic pattern means the L&S pattern in which the same pattern is continued one-dimensionally or two-dimensionally.

As mentioned above, even in the case where the conventional Levenson type phase-shifting mask or the halftone type phase-shifting mask is used, it is difficult to sufficiently exert effect in exposing both the isolated pattern (contact hole, isolated space pattern, isolated line pattern), and the L&S pattern.

SUMMARY OF THE INVENTION

An object of the present invention is to provide a photomask, which is applicable to exposure of both a line and space pattern (L&S pattern) and an isolated pattern (contact hole, isolated space pattern, isolated line pattern) with high resolution, and an exposing method using the photomask.

A second object of the present invention is to provide a method for manufacturing the above photomask.

According to a first aspect of the present invention, there is provided a photomask used in a projection exposure apparatus for exposing a predetermined pattern on a wafer through a projection optical system, including a mask pattern formed by a periodic pattern substantially twice as large as the predetermined pattern when the predetermined pattern is a periodic pattern, wherein the mask pattern is formed of light transmission portions for transmitting exposure light, and halftone portions, each having predetermined transmittance, formed such that a phase difference between each of the light transmission portions and each of the halftone portions is set to be substantially 180°. When an area of each of the light transmission portions is A1, and an area of each of the halftone portions is A2, amplitude transmittance (t) of the halftone portion is as follows:

$$t = A1/A2$$

Furthermore, the mask pattern is formed at a pupil position such that ±n-th order (n>1) diffraction light of exposure light transmitted through the photomask in at least one direction is distributed out of the pupil position.

According to the above-mentioned structure, in order to obtain the periodic pattern of periodicity D, there is provided the mask pattern having a periodic pattern substantially twice as large as the predetermined pattern, and transmittance of the halftone portion, and the aperture portion, with area ratio of the halftone portion set as mentioned above. By exposure using the above-mentioned photomask, the pattern having no zeroth order diffraction light generated and having resolution, which is substantially the same as the Levenson type phase shift mask, can be formed on the wafer. At the same time, the resolution effect can be also obtained in the isolated pattern such as contact holes formed on the same mask by use of lower σ illumination.

Moreover, when the predetermined pattern has one-dimensionally periodicity, the following relationship can be established:

$$D \times (NA/\lambda) \times (1.0+\sigma) \leq 1.0$$

wherein D: periodicity of the predetermined pattern to be transferred on the wafer, NA: numerical aperture of the exposure apparatus, λ: a wavelength of exposure light, σ: a coherence factor of a light source, and a condition of σ≦0.4 must be satisfied.

Furthermore, when the predetermined pattern has substantially the same periodicity in two directions perpendicular to each other in a two-dimensional plane, the following relationship can be established:

$$D2 \times (NA/\lambda) \times (1.0+\sigma) \leq 1.0$$

wherein D1, D2 (D1≧D2): each periodicity in two directions perpendicular, NA: numerical aperture of the projection exposure apparatus, λ: a wavelength of exposure light, σ: a coherence factor of a light source, and a condition of σ≦0.4 must be satisfied.

By satisfying the above conditions, the pattern having periodicity one-dimensionally or two-dimensionally can be exposed on the wafer with high resolution.

According to a second aspect of the present invention, there is provided a method for irradiating a photomask with exposure light to expose a predetermined pattern onto a wafer, comprising the steps of:

a) forming a mask pattern by a periodic pattern substantially twice as large as the predetermined pattern when the predetermined pattern is a periodic pattern;

b) forming light transmission portions for transmitting exposure light and halftone portions, having predetermined transmittance, such that a phase difference between each of the light transmission portions and each of the halftone portions is set to be substantially 180°, and the light transmission portions and halftone portions form the mask pattern; and c) exposing the predetermined pattern on the wafer to establish the following relationship when the predetermined pattern has one-dimensionally periodicity:

$$D \times (NA/\lambda) \times (1.0+\sigma) \leq 1.0$$

wherein D: periodicity of the predetermined pattern to be transferred on the wafer, NA: numerical aperture of the exposure apparatus, λ: a wavelength of exposure light, σ: a coherence factor of a light source, and a condition of σ≦0.4 must be satisfied.

According to a third aspect of the present invention, there is provided a method for irradiating a photomask with exposure light to expose a predetermined pattern onto a wafer, comprising the steps of:

a) forming a mask pattern by a periodic pattern substantially twice as large as the predetermined pattern when the predetermined pattern is a periodic pattern;

b) forming light transmission portions for transmitting exposure light and halftone portions, having predetermined transmittance, such that a phase difference between each of the light transmission portions and each of the halftone portions is set to be substantially 180°, and the light transmission portions and halftone portions form the mask pattern; and c) exposing the predetermined pattern on the wafer to establish the following relationship when the predetermined pattern has substantially the same periodicity in two directions perpendicular to each other in a two-dimensional plane:

$$D2 \times (NA/\lambda) \times (1.0+\sigma) \leq 1.0$$

wherein D1, D2 (D1≧D2): each periodicity in two directions perpendicular, NA: numerical aperture of the projection exposure apparatus, λ: a wavelength of exposure light, σ: a coherence factor of a light source, and condition of σ≦0.4 must be satisfied.

According to a fifth aspect of the present invention, there is provided a method for manufacturing a photomask used in a projection exposure apparatus for exposing a predetermined pattern onto a wafer through a projection optical system, comprising the steps:

a) forming a mask pattern by a periodic pattern substantially twice as large as the predetermined pattern when the predetermined pattern is a periodic pattern; and b) forming light transmission portions for transmitting exposure light and halftone portions, having predetermined transmittance, such that a phase difference between each of the light transmission portions and each of the halftone portions is set to be substantially 180°, and the light transmission portions and halftone portions form the mask pattern.

According to the above-mentioned method for manufacturing the photomask, the halftone portions are irradiated with light and charged particles in accordance with the mask pattern of the photomask, so that transmittance of the halftone portions can be set to a predetermined value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a view showing a distribution of diffraction light at a pupil position when the photomask of FIG. 3 is irradiated with light emitted from a point light source;

FIG. 6 is a view schematically showing a two dimensional distribution of diffraction light at a pupil position when the photomask of FIG. 3 is irradiated with light emitted from a partially coherent light source (coherence factor σ);

FIG. 7 is a view showing a distribution of light intensity obtained by the photomask of FIG. 3;

FIG. 8 is a view showing a mask pattern of a photomask of a second embodiment of the present invention;

FIG. 9 is a view showing a two dimensional distribution of diffraction light at a pupil position obtained by the photomask of FIG. 8;

FIG. 10 is a view showing a distribution of light intensity obtained by the photomask of FIG. 8;

FIGS. 11A and 11B are a view showing a distribution of light intensity when a mask pattern for exposing an L&S pattern is formed and a view showing a distribution of light intensity when a mask pattern for exposing an isolated space pattern is formed in the photomask of the present invention, respectively;

FIG. 12 is a conceptual view showing control of an amount of exposure light to irradiate the photomask of the present invention;

FIG. 13 is a view showing an example for performing the controlling of an amount of exposure light shown in FIG. 12; and FIG. 14 is a conceptual view showing that amplitude transmittance is controlled to form a halftone portion in accordance with the mask pattern formed on the photomask of the present invention.

DETAILED DESCRIPTION OF THE PREFERRED EMBODIMENTS

The following will explain first and second embodiments with reference to the drawings.

Figure 1A:
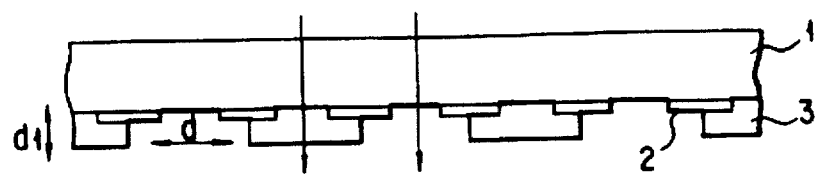
FIGS. 1A to 1E are views explaining a Levenson type phase-shifting mask.
Figure 1B:
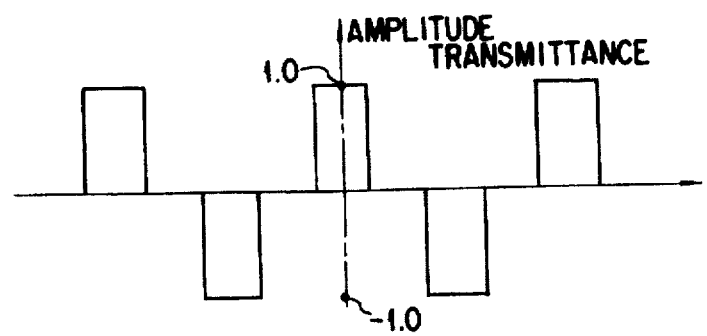
Figure 1C:
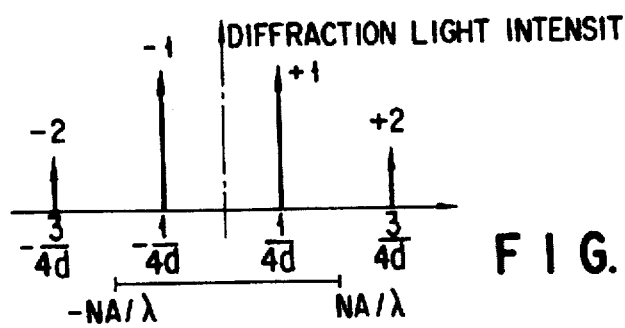
Figure 1D:
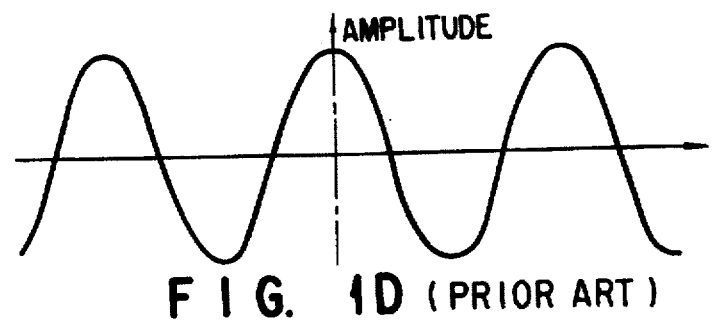
Figure 1E:
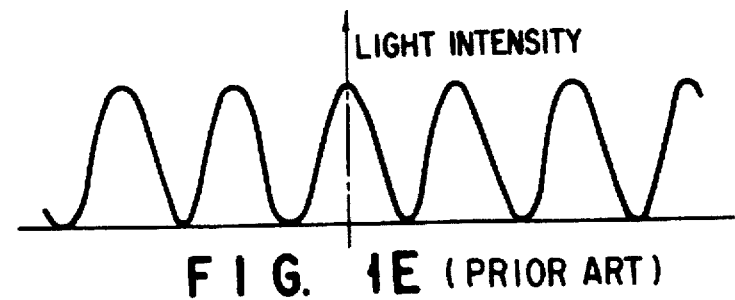
Figure 2A:
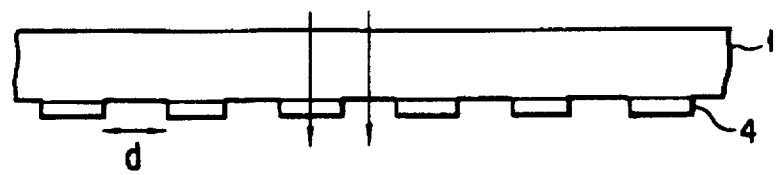
FIGS. 2A to 2E are views explaining a halftone type phase-shifting mask.
Figure 2B:
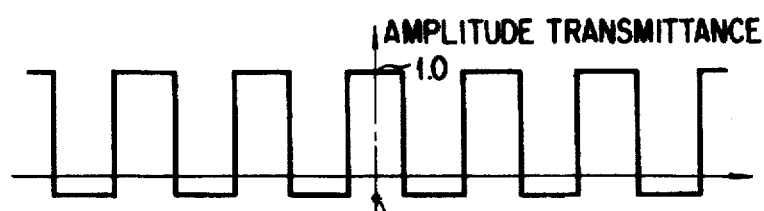
Figure 2C:
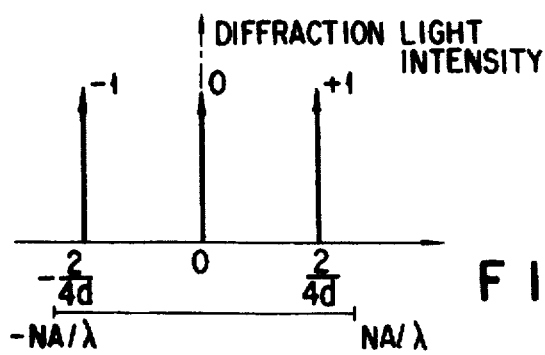
Figure 2D:
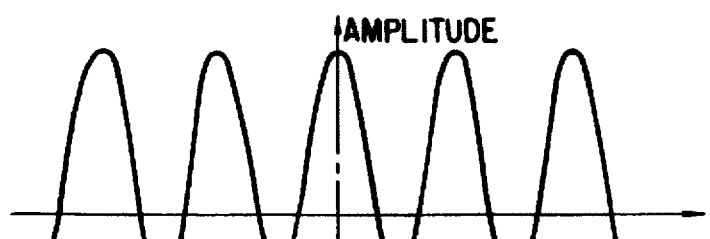
Figure 2E:
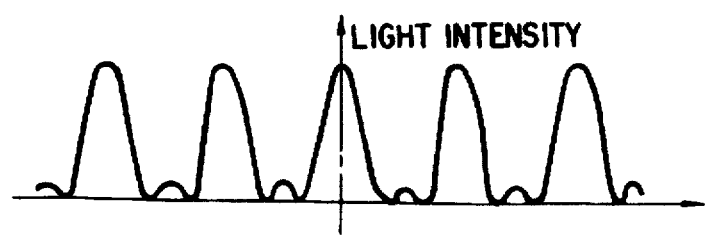
Figure 3:
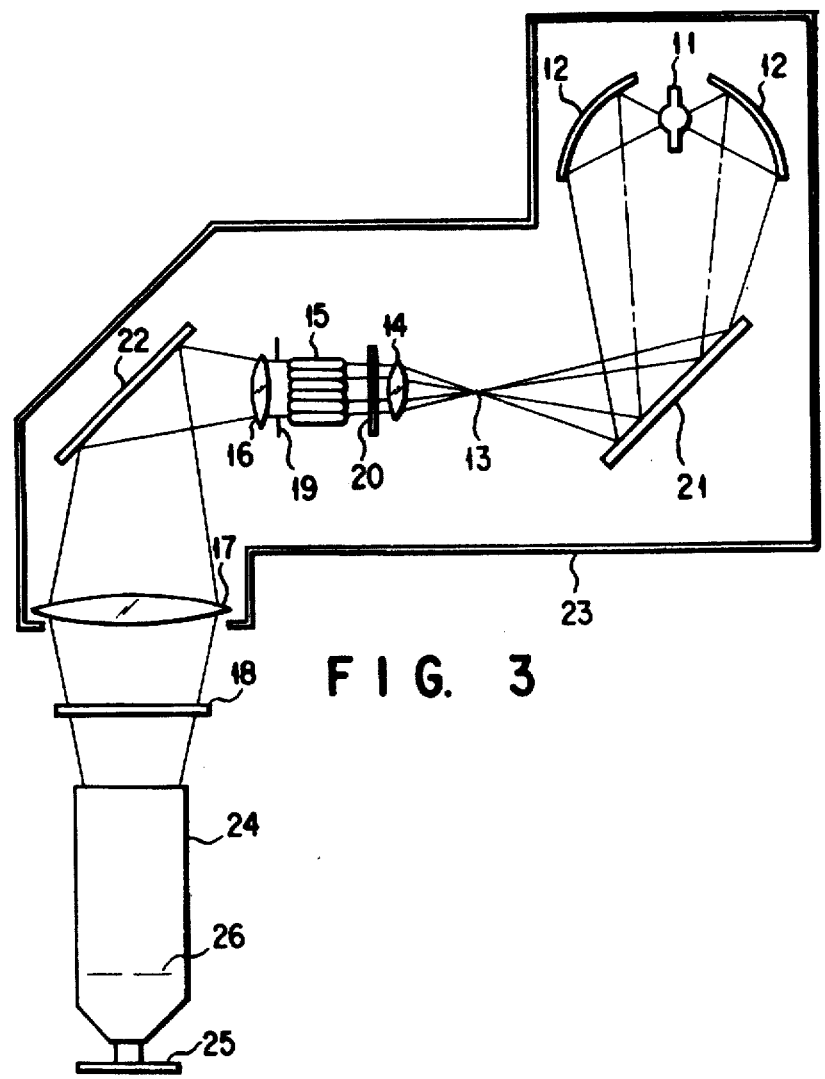
FIG. 3 is a block diagram showing an outline structure of an projection exposure apparatus to which a photomask (phase-shifting mask) of a first embodiment is applied.

FIG. 3 shows the structure of a projection exposure apparatus to which a photomask of a first embodiment of the present invention is applied. In the figure, 11: a light source (lamp), 12: an elliptical reflecting mirror, 13: a second focal point of the elliptical reflecting mirror, 14: an input lens, 15: an optical integrator, 16: an output lens, 17: a collimation lens, 18: a photomask (reticle), 19: a diaphragm, 20: a filter, 21, 22: cold mirrors, 23: a lamp house, 24: a projection optical system for projecting a pattern image formed on a photomask 18 onto a wafer by lenses, the mirror, or the combination, 25: a wafer, and 26: a diaphragm deciding a number of apertures, which is called as a pupil.

As the light source 11, a mercury lamp or a laser source is applied. If the mercury lamp is adapted, a g-line (436 nm), an h-line (405 nm), an i-line (365 nm), or a continuous spectrum in the vicinity of these wavelengths is extracted from the mercury lamp and is used. Due to this, the lamp 11, serving as a light source, needs high luminance. Moreover, in consideration of efficiency of light convergence and uniformity of light irradiation, the light source may be similar to a point light source. However, since such an ideal light source does not in actuality exist, there is used the lamp 11 having a distribution of finite light intensity. Then, light emitted from such lamp 11 is converted to light having high efficiency of light convergence and good uniformity of light irradiation.

In the projection exposure apparatus of FIG. 3, the lamp 11 is provided at the first focal point of the elliptical reflecting mirror 12, the beam is once gathered in the vicinity of the second focal point 13 of the elliptical reflecting mirror 12. Thereafter, the beam is adjusted to be substantially a parallel beam by the input lens 14 whose focal point is substantially common to the second focal point 13 so as to be made incident onto the optical integrator 15. The optical integrator 15 is formed of a large number of rod-shaped lenses, which are called fly-eye lenses. The uniformity of irradiation of the beam is improved by the optical integrator 15, and the input lens 14 is used to increase efficiency of the light beam passed through the optical integrator 15.

Light outputted from the optical integrator 15 is converged such that the beam outputted from the respective lenses of the optical integrator 15 is superimposed at the photomask 18 to be irradiated. The beam of light incident onto the optical integrator 15 has a variation in the distribution of light intensity. However, the beam outputted from the respective lenses of the optical integrator 15 is substantially equally superimposed, so that intensity of irradiation on the photomask 18 is made substantially uniform. In a case where the distribution of intensity of light made incident onto the optical integrator 15 is nearly made uniform, intensity of irradiation on the photomask 18 on which the emitted light is superimposed is further made uniform. The diaphragm 19 is provided on the light emission side of the optical integrator 15, and a side of the light emission side of the optical integrator 15 is decided.

In a case where the mercury lamp is used as the light source 11 and the beam is converged by the elliptical reflecting mirror 12, the beam of the lamp in an axial direction cannot be extracted since the structure of the mercury lamp is longitudinal and both ends are electrodes as shown in FIG. 3. Due to this, as shown in FIG. 3, in a case where only a convex lens, serving as the input lens 14, is used, there is a case in which the distribution of intensity of light entering the central portion of the optical integrator 15 is lowered. At this time, there is a case in which a conical lens whose both sides are convex or one surface is convex and the other side is concave is inserted between the input lens 14 and the optical integrator 15 to make uniform the distribution of intensity of light made incident onto the optical integrator 15.

The filter 20 is used to pass only light have a wavelength in which aberration of an optical system is corrected. The cold mirrors 21 and 22 serve to bend the optical path to lower the height of the apparatus, and pass a light/heat wave having long-wavelength to be absorbed into a portion of the lamp house 23, which can be cold. Light with which the photomask 18 is irradiated is passed through the projection optical system 24. Then, the wafer 25 is irradiated with light, so that an image of the fine pattern formed on the photomask 18 is transferred onto resist on the wafer 25 to be projected and exposed.

The following will explain the details of the photomask 18 of FIG. 3.

Figure 4A:
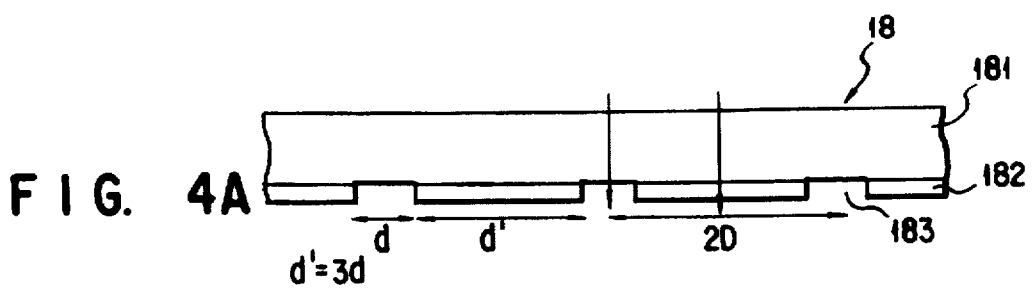
FIGS. 4A and 4B are a cross sectional view explaining the photomask of FIG. 3, and a distribution of amplitude transmittance, respectively.
Figure 4B:
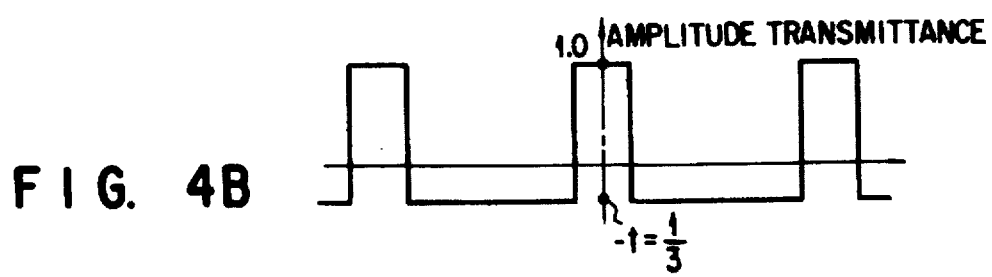

FIGS. 4A and 4B are a cross sectional view of the photomask 18, and a distribution of amplitude transmittance, respectively. As shown in FIG. 4A, on a mask substrate 181, there are provided halftone portions 182 for transmitting exposure light at a predetermined amplitude transmittance (t) to reverse a phase. According to the first embodiment, a ratio of the size of each halftone portion 182 (d') to that of each light transmission portion 183 (d) is 3:1, amplitude transmittance of each halftone portion 182 is 33.3%, and a phase difference is set to π (FIG. 4B). In other words, in a case where an area of each light transmission portion is A1, and an area of each halftone portion is A2, the above amplitude transmittance (t) has the following relationship:

$$t=A1/A2 \tag{1}$$

Generally, amplitude transmittance (t) being less than or equal to 50% is used. According to the above first embodiment, the photomask having the above-mentioned structure is irradiated with illumination having a reduced value of σ, which is a coherence factor, and the mask is exposed, so that an L&S pattern having a ratio of 1:1 can be obtained.

If the amplitude transmittance (t) deviates from an optimal value for exposing of the mask pattern, each peak value of light intensity by exposure, that is, each peak intensity on the wafer is not made uniform. There is a simulation of exposing mask for 0.15 μm L&S patterns (size d of the light transmission portion is 0.15 μm) in case wherein a size of halftone portion 182 is 0.45 μm and the amplitude transmittance t is ⅓−Δt. Furthermore, the ratio of intensity of adjacent peaks is expressed by following expression.

$$I(P1)/I(P2)=\text{Peak-Ratio (P.R.)}$$

P1, P2: intensity peak position $$(I(P2) \geq I(P1))$$

In this case, the P.R. is lower than or equal to 90% when Δt≧6%. As regards an error of the amplitude transmittance (t), therefore, it is preferable that Δt/t≦20%.

The following will explain the point in which the L&S pattern is formed on the wafer 25 by patterning the photomask 18.

FIG. 5 shows a distribution of diffraction light at a pupil position when the photomask having the distribution of transmittance shown in FIG. 4B is irradiated with light emitted from a point light source. The distribution of diffraction light corresponds to a distribution, which is obtained by Fourier-transforming the distribution of transmittance. As mentioned above, similar to the Levenson type phase-shifting mask, no zeroth order diffraction light is generated in the mask in which the ratio of the size between the light transmission portion and the halftone portion, and transmittance (t) are set. Therefore, it is possible to perform L&S pattern transfer in which two beam interference can be realized under illumination having lower value σ, and resolution corresponding to the case of the Levenson type phase-shifting mask can be obtained.

FIG. 6 schematically shows a two dimensional distribution of diffraction light at the pupil position, which can be obtained when the photomask having the distribution of transmittance shown in FIG. 4B. A radius of the pupil can be expressed by NA/λ using the numerical aperture NA and the wavelength λ of exposure light. At this time, the diffraction image is distributed at the pupil position by the mask pattern as shown in FIG. 6. Thereby, in a case where whole ±2nd order diffraction light is distributed out of the pupil, there can be obtained distribution of diffraction light having only two beam interference, which is similar to the case of the Levenson type phase-shifting mask. In order to distribute whole ±2nd order diffraction light out of the pupil position, the following expression must be established:

$$D \times (NA/\lambda) \times (1.0+\sigma) \leq 1.0 \tag{2}$$

wherein a transfer pattern periodicity on the predetermined wafer 25 is D, the numerical aperture of the exposure apparatus is NA, the wavelength of exposure light is λ, the coherence factor of the light source is σ, and a condition of σ≦0.4 must be satisfied.

FIG. 7 shows a simulation result of the distribution of light intensity obtained from the first embodiment.

As shown in FIG. 7, in the case of using the above-mentioned photomask, there can be formed the L&S pattern whose ratio is 1:1, that is, a pattern of ½ periodicity of the mask pattern formed on the photomask 18 by the mask pattern whose size ratio of the light transmission portion to the halftone portion is 1:3. Moreover, as shown in a case of d=0.2 μm of FIG. 7, if the exposure is performed under a condition deviating from the above expression (2), it can be understood that the size of the line and that the space of the L&S pattern are changed from each other. The change is caused when the ±2nd order diffraction light enters the pupil to be distributed to the image-formation.

In a case where the pattern of d=0.18 μm to be resolved by the present invention is formed by a halftone mask whose periodicity is the same the wafer surface (1:1), it can be understood that the pattern cannot be resolved in a condition of σ=0.5 since whole ±1st order diffraction light is distributed out of the pupil.

It is noted that the size ratio of the transmission portion 183 to the halftone portion 182 shown in the first embodiment is not always 1:3. The ratio is changed, so that transmittance of the halftone film can be suitably changed. Moreover, amplitude intensity of exposure light which is transmitted through the halftone portion is not always conformed to amplitude intensity of exposure light which is transmitted through the light transmission portion. However, these amplitude intensities are preferably conformed to each other to check the agreement between the size of resolution and that of the light transmission portion.

The following will explain a second embodiment of the present invention with reference to FIGS. 8 to 10.

FIG. 8 shows a mask pattern of a photomask 27 of the second embodiment. In the first embodiment, the photomask 18 is applied to the exposure of the L&S pattern. In contrast, in the second embodiment, the photomask 27 is periodically provided on a two-dimensional plane to be applied to the exposure of the isolated pattern such as the contact hole. Moreover, since the photomask 27 can be applied to the apparatus having the same structure as the exposure apparatus of FIG. 3, the detailed explanation of the exposure apparatus is omitted.

The mask pattern formed on the photomask 27 of FIG. 8 is used to expose the contact holes, which are formed to have the same periodicity (periodicity of 0.4 μm) in two directions perpendicular to each other on the two-dimensional plane, onto the wafer. The size of the aperture is d=0.2 μm, and amplitude transmittance (t) of the halftone portion is $1/7 \approx 14.3\%$. In other words, in the photomask 27 of FIG. 8, amplitude transmittance (t) is decided to satisfy the above-mentioned expression (1). Moreover, similar to the first embodiment, FIG. 9 shows a schematic view of a two dimensional distribution of diffraction light, which can be obtained at the pupil position obtained by the mask pattern when the photomask 27 is irradiated with illumination having a lower σ value to be exposed. FIG. 10 shows a simulation result of the distribution of light intensity obtained by the mask pattern.

The radius of the pupil can be expressed by NA/λ using the numerical aperture NA and the wavelength λ of exposure light, and whole ±2nd order diffraction light is distributed out of the pupil as shown in FIG. 9. As mentioned above, for forming the pattern having the same periodicity in two directions perpendicular to each other on the two-dimensional plane, the relationship among the numerical aperture NA of the projection exposure apparatus to be used, the wavelength λ of exposure light, and coherence factor σ of the light source can be expressed by the following expression (3):

$$D2 \times (NA/\lambda) \times (1.0 + \sigma) \leq 1.0 \quad (3)$$

wherein the periodicity in two directions perpendicular to each other on the wafer to be exposed are D1, D2 (D1≧D2), and σ≦0.4.

In the above expression (3), periodicity D2, which is shorter than periodicity D1, is used to consider a case in which resolution to the periodicity D2 becomes worse when variables are decided to satisfy the above expression (3) by use of the periodicity D1.

Various kinds of exposure conditions used in the simulation of FIG. 10 are set as follows:

NA=0.5

λ=248 nm

σ=0.2

These conditions satisfy the conditions of the expression (3). Thereby, the contact hole having the periodicity of 0.4 μm can be exposed.

Regarding the cases other than the pattern shown in the second embodiment, for example, a case in which the pattern periodicity largely differs in the periodical direction, and a case in which the periodicity in two directions are not perpendicular to each other, it is not always needed that transmittance of the halftone film be set not to generate the zeroth order diffraction light as shown in the expression (1). Conversely, there is a case in which transmittance is set to have an allowable difference, so that a faithful pattern can be obtained. Moreover, the mask pattern is formed by a double periodicity, and an auxiliary pattern not to be resolved, bias of the pattern, and the shape of the corner portion may be changed to improve accuracy of the transfer pattern.

In the above-mentioned first and second embodiments, a lower σ value is used as coherence factor σ, whereby the effect of the present invention can be obtained in a wide range.

Moreover, the transmittance of the halftone portion and the phase difference between the light transmission portion and the halftone portion are not always set to strictly satisfy the relationship which is above-mentioned, and they may be set under an allowable condition to some extent.

Moreover, the pattern to be used to form the photomask of the present invention is not always the periodic pattern, and the isolated patterns such as contact holes can be simultaneously formed, and exposed simultaneously.

In a case where the above-mentioned mask pattern and the other mask pattern are formed on the same photomask to be exposed, it is needed that an amount of exposure light be adjusted. FIGS. 11A and 11B show a distribution of light intensity of the L&S obtained by the present invention, and a distribution of light intensity obtained when the isolated patterns are exposed with the same amount of exposure light. The conditions of exposure used in this calculation are set as follows: NA=0.5, λ=248 nm, σ=0.3, just-focus.

Even if the size bias is added to the aperture portion of the isolated pattern in using the same transmittance of the halftone portions, it can be understood that unnecessary side lobes SR1 and SR2 are transferred to the isolated patterns when exposure is performed with a suitable amount of exposure light to obtain the L&S pattern. In order to avoid the occurrence of this problem, to add to the size bias, it can be considered that the amount of exposure light is varied on the mask. FIG. 12 is a conceptual view showing control of the amount of exposure light. As shown in FIG. 12, a control section 28 controls the amount of exposure light to be irradiated to a photomask 29 in accordance with the mask pattern formed on the photomask 29. For example, in a case where there is used a method in which the mask surface is not exposed at one time but the small areas are exposed while being scanned for an exposure field 30 as shown in FIG. 13, the area formed of the isolated patterns is exposed by the amount of exposure light which is smaller that the amount of exposure light to be used in exposure of the L&S pattern, as shown in FIG. 11A. By changing the size of aperture of the isolated patterns and exposure light in the area on the mask formed by the isolated patterns, a predetermined pattern can be transferred on the wafer. The control section 28 can be provided in the projection exposure apparatus shown in FIG. 3.

Moreover, light or charged particles are locally irradiated onto the halftone portion in accordance with the mask pattern without providing the above-mentioned control section, so that transmittance of the halftone portion may be adjusted to a predetermined value when the photomask 29 is manufactured. For example, in a case where the halftone portion for exposing the L&S patterns and the halftone portion for exposing the isolated patterns are formed, a light and charged particle irradiation section 30 irradiates different light and charges particles 11 and 12 onto the halftone portion in accordance with mask pattern data 31 showing the mask pattern to be formed. Thereby, for example, amplitude transmittance (t) of the halftone portion for exposing the L&S patterns can be adjusted to 30%, and amplitude transmittance (t) of the halftone portion for exposing the isolated patterns can be adjusted to 10%.

As explained above, according to the present invention, exposure can be performed onto the L&S patterns with limitation resolution, which is similar to the case of the Levenson type phase-shifting mask, and onto the isolated patterns such as contact holes with resolution, which is similar to the case of the halftone type shift mask, by use of one photomask.

Additional advantages and modifications will readily occur to those skilled in the art. Therefore, the invention in its broader aspects is not limited to the specific details, representative apparatuses, and illustrated examples shown and described herein. Accordingly, various modifications may be made without departing from the spirit or scope of the general inventive concept as defined by the appended claims and their equivalents.

What is claimed is:

1. A photomask used in a projection exposure apparatus for exposing a desired pattern including a fine periodic pattern on a wafer through a projection optical system, comprising:

a mask pattern formed by a periodic pattern controlled to have a pitch greater than a predetermined pattern pitch and substantially twice as large as said desired pattern when said desired pattern is a periodic pattern;

wherein;

said mask pattern is formed of light transmission portions for transmitting exposure light, and halftone portions, having predetermined transmittance, formed such that a phase difference between each of said light transmission portions and each of said halftone portions is set to be substantially 180°; and an amount of exposure light and a numerical aperture (NA) of the projection optical system are controlled so that a periodic pattern having a period half that of the mask pattern is formed on the wafer.

2. The photomask according to claim 1, wherein when an area of each of said light transmission portions is A1, and an area of each of said halftone portions is A2, amplitude transmittance (t) of each of said halftone portions is as follows:

$$t = A1/A2.$$

3. The photomask according to claim 1, wherein said mask pattern is formed at a pupil position such that ±n-th order (n>1) diffraction light of exposure light transmitted through said photomask in at least one direction is distributed out of said pupil position.

4. The photomask according to claim 1, wherein when said predetermined pattern has one-dimensional periodicity, the following relationship can be established:

$$D \times (NA/\lambda) \times (1.0+\sigma) \leq 1.0$$

wherein D: periodicity of said desired pattern to be transferred on said wafer, NA: numerical aperture of the projection exposure apparatus, λ: a wavelength of exposure light, σ: a coherence factor of a light source, and a condition of $\sigma \leq 0.4$ must be satisfied.

5. The photomask according to claim 1, wherein when said predetermined pattern has substantially the same periodicity in two directions perpendicular to each other in a two-dimensional plane, the following relationship can be established:

$$D2 \times (NA/\lambda) \times (1.0+\sigma) \leq 1.0$$

wherein D1, D2 (D1≧D2): each periodicity in two directions perpendicular, NA: the numerical aperture of the projection exposure apparatus, λ: a wavelength of exposure light, σ: a coherence factor of a light source, and a condition of $\sigma \leq 0.4$ must be satisfied.

6. The photomask according to claim 1, wherein each of said halftone portions has a different transmittance in accordance with kinds of patterns.

7. A method for irradiating a photomask with exposure light to expose a desired pattern including a fine periodic pattern onto a wafer, comprising the steps of:

forming a mask pattern by a periodic pattern substantially twice as large as said fine periodic pattern, including, forming light transmission portions for transmitting exposure light and halftone portions, having predetermined transmittance, such that a phase difference between each of said light transmission portions and each of said halftone portions is set to be substantially 180°, said light transmission portions and halftone portions forming said mask pattern; and exposing said desired pattern on said wafer to establish the following relationship when said desired pattern has one-dimensional periodicity:

$$D \times (NA/\lambda) \times (1.0+\sigma) \leq 1.0$$

wherein D: periodicity of said desired pattern to be transferred on said wafer, NA: numerical aperture of the exposure apparatus, λ: a wavelength of exposure light, σ: a coherence factor of a light source, and a condition of $\sigma \leq 0.4$ must be satisfied.

8. The method according to claim 7, wherein said step a) includes a step of forming said mask pattern at a pupil position such that ±n-th order (n>1) diffraction light of exposure light transmitted through said photomask in at least one direction is distributed out of said pupil position.

9. The method according to claim 7, further comprising the steps of:

changing an amount of exposure light provided to the mask pattern formed by said step a), and an amount of exposure light provided to the other mask patterns.

10. A method for irradiating a photomask with exposure light to expose a desired pattern including a fine periodic pattern onto a wafer; comprising the steps of:

forming a mask pattern by a periodic pattern substantially twice as large as said fine periodic pattern, including, forming light transmission portions for transmitting exposure light and halftone portions, having predetermined transmittance, such that a phase difference between each of said light transmission portions and each of said halftone portions is set to be substantially 180°, said light transmission portions and halftone portions forming said mask pattern; and exposing said desired pattern on said wafer to establish the following relationship when said desired pattern has substantially the same periodicity in two directions perpendicular to each other in a two-dimensional plane:

$$D2 \times (NA/\lambda) \times (1.0+\sigma) \leq 1.0$$

wherein D1, D2 (D1≧D2): each periodicity in two directions perpendicular, NA: numerical aperture of the projection exposure apparatus, λ: a wavelength of exposure light, σ: a coherence factor of a light source, and a condition of $\sigma \leq 0.4$ must be satisfied.

11. The method according to claim 10, comprising positioning said mask pattern at a pupil position such that ±n -th order (n>1) diffraction light of exposure light transmitted through said photomask in at least one direction is distributed out of said pupil position.

12. The method according to claim 10, further comprising the steps of:

changing an amount of exposure light provided to the mask pattern formed by said step a), and an amount of exposure light provided to the other mask patterns.

13. A method for manufacturing a photomask used in a projection exposure apparatus for exposing a desired pattern including a fine periodic pattern onto a wafer through a projection optical system, comprising the steps:

forming a mask pattern by a periodic pattern substantially twice as large as said fine periodic pattern including, forming light transmission portions for transmitting exposure light and halftone portions, having predetermined transmittance, such that a phase difference between each of said light transmission portions and each of said halftone portions is set to be substantially 180°, said light transmission portions and halftone portions including said mask pattern.

14. The method according to claim 13, further comprising the steps of:

irradiating said halftone portions with light and charged particles in accordance with a mask pattern of said photomask.

* * * * *